United States Patent [19]

Kilian

[11] 3,866,125

[45] Feb. 11, 1975

[54] CIRCUIT ARRANGEMENT FOR A RECEIVER FOR FREQUENCY-MODULATED SIGNALS HAVING VARIABLE ATTENUATION PHASE SHIFTER

[75] Inventor: Ernst-August Kilian, Hamburg, Germany

[73] Assignee: U.S. Philips Corporation, New York, N.Y.

[22] Filed: Aug. 15, 1973

[21] Appl. No.: 388,342

[30] Foreign Application Priority Data

Aug. 23, 1972 Germany ........................... 2241344

[52] U.S. Cl. ................. 325/348, 325/476, 325/487, 329/137

[51] Int. Cl. ........................................... H04b 1/16

[58] Field of Search. 179/15 BT; 325/344, 347–349, 325/377, 378, 476, 487; 329/131–136, 178, 179, 137

[56] References Cited

UNITED STATES PATENTS 2,808,508 10/1957 Sinninger ........................... 325/347

3,328,529 6/1967 Heald ............................. 179/15 BT

*Primary Examiner*—Robert L. Griffin

*Assistant Examiner*—George H. Libman

*Attorney, Agent, or Firm*—Frank R. Trifari; Henry I. Steckler

[57] ABSTRACT

In FM receivers with filters having steep edges and FM demodulators without suppression of the amplitude modulation (for example, quadrature demodulators such as are particularly used in integrated circuits) LF signals may occur in the vicinity of the useful signal during tuning to a transmitter. The amplitude of these LF signals is considerably larger than that of the desired signal although the value of the aerial signal is considerably lower than when tuning to the input signal.

According to the invention this effect is suppressed in that the phase-shifting network with the aid of which a frequency-dependent phase shift of the input signal is obtained is attenuated as a function of the amplitude of the filtered IF signal. The embodiment according to the invention can be formed in an integrated technique.

6 Claims, 1 Drawing Figure

PATENTED FEB 11 1975 3,866,125
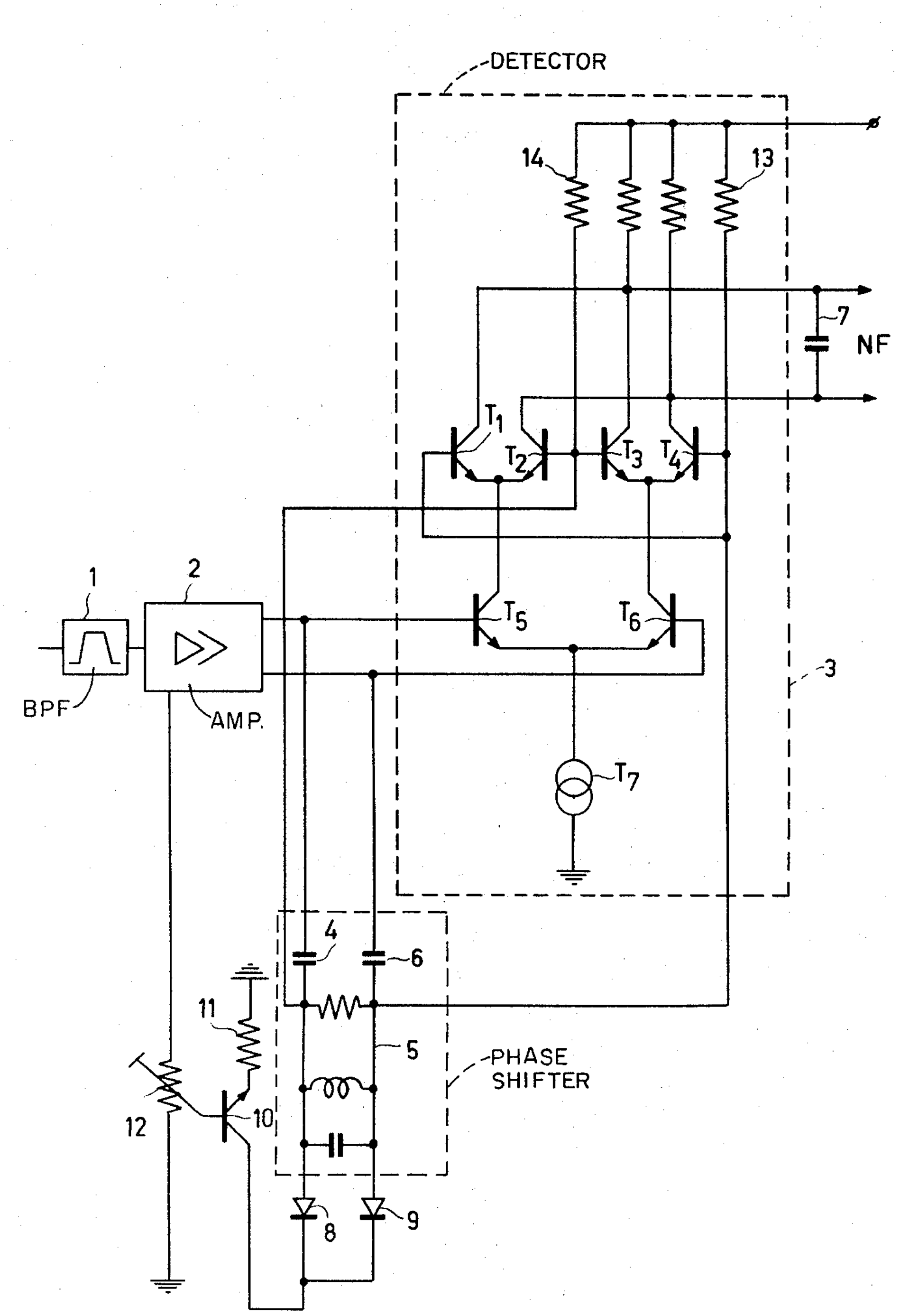

CIRCUIT ARRANGEMENT FOR A RECEIVER FOR FREQUENCY-MODULATED SIGNALS HAVING VARIABLE ATTENUATION PHASE SHIFTER

The invention relates to a circuit arrangement for a receiver for frequency-modulated signals with filtering means tuned to an intermediate frequency, an intermediate frequency amplifier and a frequency detector comprising a phase-shifting network for generating a frequency-dependent phase shift, and a stage whose output signal amplitude is dependent on the phase shift.

Such a circuit arrangement is known. The phase-shifting network used in this case comprises a bandpass filter consisting of two circuits and being tuned to the intermediate frequency (for example the ratio detector), or resonant circuits tuned to the intermediate frequency are used (see for example German published Pat. application No. 1 766 837).

The dense occupation of the FM band with FM transmitters on the one hand which has led to ever decreasing frequency distances between the separate transmitters and the use of IF amplifiers in the integrated circuit technique on the other hand make the use of IF filters having a high selection, for example, ceramic filters necessary. In addition the use of integrated circuits has led to the fact that FM detector circuits such as the ratio detector have been abandoned. Instead so-called quadrature demodulators (see "Integrierte Schaltung TCA 420" of Valvo GmbH.,) which can be largely integrated are used. As compared with the ratio detector these circuits have the drawback that they may also be activated by a possible amplitude modulation of the FM signal.

The use of IF filters having a high selection on the one hand and FM detectors without AM suppression on the other hand has the result that in circuit arrangements of the kind described above greatly distorted signals are received when selecting transmitters, while the amplitude of these signals is larger than in case of correct tuning. These pertubations of the receiver stations may be explained by two effects:

The FM signal is converted into an AM signal on the edge of the selection curves. This amplitude modulation is the stronger as the edges of the filter are steeper.

Due to the high selection of the filter the amplitude of these signals is so small that they pass unlimited through the IF amplifier so that the AM signals are present at the two inputs of the FM detector. This detector then acts as a product detector and produces a distorted LF output signal whose amplitude may be several times larger than that in case of a correct tuning.

This proves that the described perturbed receptions are automatically produced when using an FM detector without AM suppression, for example, the so-called quadrature demodulator together with selection means having a large edge steepness.

To avoid interference signals in the receiver when selecting a transmitter so-called silent tuning circuits have already been used in which a direct voltage dependent on the field strength is formed which cuts off the LF channel by means of an adjusting element as soon as the input signal comes below a given value. Such circuits are, however, relatively expensive.

It is therefore an object of the invention to provide a circuit arrangement of the above-mentioned kind with low cost in such a manner that the described effects cannot occur when selecting a transmitter.

According to the invention this object is achieved in that the attenuation of the phase-shifting network can be controlled as a function of the amplitude of the filtered IF signal in such a manner that for a decreasing amplitude the attenuation of the phase-shifting network increases. The attenuation of the phase-shifting network has a double effect: when the attenuation increases the amplitude of the signal derived from the phase-shifting network becomes smaller; on the other hand the dependence of the phase shift on the frequency becomes less so that a smoother demodulation curve is produced.

The invention will be further described with reference to an embodiment shown in the drawing.

The drawing which shows part of an FM radio receiver shows an IF filter 1 which may be formed as a band-pass filter having several circuits or as a ceramic filter. The output signal of the IF filter is applied to an IF amplifier 2 which has such an amplification that the output signal thereof is generally limited. The output signal from the IF amplifier is applied on the one hand directly and on the other hand phase-shifted via a phase-shifting network to a stage 3 whose amplitude of the output signal is dependent on this phase shift. The phase-shifting network consists of the series arrangement of a first capacitor 4, a parallel resonant circuit 5 and a second capacitor 6 arranged in series between the outputs of the IF amplifier 2. The phase-shifted signal is derived from the parallel resonant circuit 4 and applied to the stage 3.

The stage 3 has two cross-coupled difference amplifier stages $T_1$, $T_2$ and $T_3$, $T_4$ which are controlled by a further difference amplifier $T_5$, $T_6$ whose emitter lead incorporates a current source $T_7$ supplying a constant current. The base electrodes of the transistors $T_5$ and $T_6$ are directly connected to the output of the IF amplifier 2 while the interconnected base electrodes of the transistors $T_1$, $T_4$ on the one hand and $T_2$, $T_3$ on the other hand are connected to the two ends of the parallel resonant circuit. The demodulation product (LF signal) is derived between the interconnected collector electrodes of the transistors $T_1$, $T_3$ on the one hand and $T_2$, $T_4$ on the other hand between which a capacitor 7 is arranged and is applied to an LF amplifier not further shown.

The amplitude of the output signal is dependent on the phase shift between the signal at the output of the IF amplifier 2 and the signal at the parallel resonant circuit 5, which shift is 90° at the intermediate frequency (10.7 MHz). For very small input signals which are not yet limited in the IF amplifier 2 and which are too small to switch the transistors $T_1$ to $T_6$ of the stage 3 the amplitude of the output signal also depends on the amplitude of the signal at the output of the amplifier 2. This amplitude dependency leads to the abovementioned interference signals when tuning to a station on the receiver. The circuit described so far with the elements 1 to 7 is known ("Integrated circuit TCA 420" of Valvo GmbH.,).

According to the invention the series arrangement consisting of two diodes 8 and 9 is arranged in parallel with the parallel resonant circuit 5 while the cathodes are connected together and to the collector of an npn-transistor 10 whoes emitter lead incorporates a feedback resistor 11 in the order of approximately 1 k.ohm.

The base of transistor 10 is connected to the wiper on a potentiometer 12 to which a direct voltage is applied which is dependent on the field strength of the input signal in such a manner that the direct voltage decreases as the field strength increases.

The circuit arrangement operates as follows:

When the tuning is such that the IF signal lies in the pass region of the filter 1, the direct voltage at the potentiometer 12 is so low that the transistor 10 is cut off. In this condition the phase-shifting network 4, 5, 6 is substantially not influenced by the attenuation elements 8 to 12. When the tuning is, however, such that the signal to be received lies in the range of the filter edges, the signal undergoes such a high attenuation by the filter that the dependent direct voltage at the potentiometer is so high that the transistor 10 is conducting while its collector current flows through the diodes 8 and 9 and resistors 13 and 14 which are arranged between the positive supply voltage and the interconnected base electrodes of the transistors $T_1$, $T_4$ and $T_3$, $T_2$. As a result the diodes become conducting so that the parallel resonant circuit 5 and hence the attenuation of the phase-shifting series-arranged resonant circuit is constituted by the elements 4, 5 and 6 is increased to a large extent. In case of an increasing attenuation the voltage derived from the parallel resonant circuit 5 and the phase shift between this voltage and the voltage at the output of the IF amplifier 2 decreases. Since the amplitude of the LF output signal from the stage 3 is dependent on the amplitude of the voltages applied to this stage and on the phase shift thereof, the output signal also decreases. A reduction of the output signal by a factor of 20 is possible in the described circuit arrangement for the described tuning to the edges of the selection curve of the filter 1.

In some FM stereo receivers a direct voltage which is dependent on the field strength and is used for switching over the stereo decoder is already available so that in those cases a special generation of a direct voltage dependent on the field strength is not necessary. The circuit arrangement according to the invention then only requires two diodes 8, 9, a transistor 10 and a resistor 11 which can be easily formed in an integrated technique and can optionally be manufactured together with the IF amplifier 2 and the stage 3 on a semiconductor substrate.

What is claimed is:

1. A circuit arrangement for a receiver for frequencymodulated signals, said circuit comprising filtering means tuned to an intermediate frequency, an IF amplifier coupled to said filtering means, a frequency detector comprising a phaseshifting network means coupled to said amplifier for generating a frequency-dependent phase shift, and a stage coupled to said network and said amplifier having an amplitude dependent on the phase shift, and means coupled to said amplifier and said network for controlling the attenuation of the phase-shifting network as a function of the amplitude of the filtered IF signal wherein the attenuation of the phase-shifting network increases as the amplitude decreases.

2. A circuit arrangement as claimed in claim 1, wherein the phase-shifting network comprises a series arrangement of at least one capacitor and a parallel resonant circuit coupled to said capacitor, and means for deriving a phase-shifted voltage from the parallel resonant circuit.

3. A circuit arrangement as claimed in claim 1 for the reception of stereo signals wherein said amplifier provides a direct voltage dependent on the field strength of the signal for automatic mono-stereo switching, said direct voltage controlling the attenuation of the phase-shifting network.

4. A circuit arrangement as claimed in claim 1, wherein said network comprises an output, and further comprising at least one diode, a transistor coupled in parallel with the output of the phase shifting network and direct coupled to said diode, said transistor being controlled by a direct voltage which varies with varying field strength of said signal.

5. A circuit arrangement as claimed in claim 4, further comprising the series arrangement of two diodes of opposite polarity coupled in parallel with the output of the phase-shifting network.

6. A circuit comprising input means for receiving a frequency modulated signal, a phase shifting network means coupled to said input means having a frequency dependent phase shift, and means coupled to said input means and said network for increasing the attenuation of said network with decreases in the amplitude of said received signal.

* * * * *